United States Patent [19]
Henderson et al.

[11] Patent Number: 6,008,130
[45] Date of Patent: Dec. 28, 1999

[54] POLYMER ADHESIVE PLASMA CONFINEMENT RING

[75] Inventors: David E. Henderson, Fremont; Ian Harvey, Livermore, both of Calif.

[73] Assignee: VLSI Technology, Inc., San Jose, Calif.

[21] Appl. No.: 08/911,470

[22] Filed: Aug. 14, 1997

[51] Int. Cl.⁶ .............................. H05H 1/00; H01L 21/00
[52] U.S. Cl. .......................... 438/710; 438/729; 156/345; 118/723 E
[58] Field of Search ............................ 156/345; 438/710, 438/729; 118/723 E, 723 R

[56] References Cited

U.S. PATENT DOCUMENTS

| | | | |
|---|---|---|---|
| 5,413,675 | 5/1995 | Ikonomou et al. | 162/5 |
| 5,474,649 | 12/1995 | Kava et al. | 156/345 |
| 5,534,751 | 7/1996 | Lenz et al. | 315/111.71 |
| 5,779,803 | 7/1998 | Kurono et al. | 156/345 |
| 5,810,931 | 9/1998 | Stevens et al. | 156/345 |

*Primary Examiner*—Thi Dang
*Attorney, Agent, or Firm*—Wells, St. John, Roberts, Gregory & Matkins, P.S.

[57] ABSTRACT

A plasma confinement ring comprising a first generally planar surface; a second generally planar surface; an aperture extending between the first and second surfaces, the aperture including an annular surface, and a curved surface extending between the annular surface and the first planar surface. A method of manufacturing a plasma reactor for processing a semiconductor wafer, the method comprising providing a reactor chamber and an electrostatic chuck in the reactor chamber for supporting a semiconductor wafer; providing a plasma confinement ring having first and second opposite surfaces, an aperture extending between the first and second opposite surfaces, the aperture being defined by an annular surface, an annular corner being defined at the intersection of the annular surface and the first surface; enhancing adhesion of condensed polymer byproducts by rounding the annular corner to provide a gradual transition from the annular surface to the first surface and roughening the rounded corner to increase surface area; and supporting the ring in the chamber.

28 Claims, 3 Drawing Sheets

POLYMER ADHESIVE PLASMA CONFINEMENT RING

TECHNICAL FIELD

The invention relates to semiconductor processing equipment and methods. More particularly, the invention relates to plasma etching.

BACKGROUND OF THE INVENTION

Single wafer plasma etchers are known in the art. Plasma etchers include a reactor chamber, a susceptor or electrostatic chuck in the reactor chamber, and a top electrode in the reactor chamber, above the electrostatic chuck. A wafer is supported on the electrostatic chuck, etching gasses are introduced into the reactor chamber, and a plasma is initiated by supplying a voltage between the top electrode and the electrostatic chuck. It is known to employ stacked plasma confinement rings in single wafer plasma etchers. A plasma confinement ring is an annular ring made of $SiO_2$ that is positioned intermediate the electrostatic chuck and the top electrode in the reactor chamber of a single wafer plasma etcher. The ring has upper and lower opposite surfaces, and has a central aperture including a vertical annular surface. The central aperture has a diameter which is just slightly larger than the diameter of the wafer. The opening in the ring focuses or centralizes the plasma over the wafer for etching purposes.

In the course of the plasma etching, and particularly when using a perfluorocarbon or hydrofluorocarbon etching gas chemistry, gas fragments condense on interior chamber surfaces and react to form short-chain "polymers." These polymers become especially thick on the interior vertical surface of the central aperture of the ring. This surface sees much more of the plasma than the upper and lower flat surfaces because plasma formed in the reactor is more concentrated against this vertical surface than upper and lower surfaces of the ring.

The polymer or precursor continues to build until the point where it must be cleaned from the surfaces. If it is not cleaned soon enough, it starts to peel or flake-off and fall and deposit either on the wafer (creating point defects) or on the electrostatic chuck, preventing adhesion of subsequent wafers to the chuck, thereby halting the process. It may also deposit on a wafer in process, leading to manufacturing defects and yield loss. The manufacturers of such plasma reactors and rings have procedures and processes as to how to clean the ring after the polymer or precursor is formed. One plasma etching apparatus, employing confinement rings, is described in U.S. Pat. No. 5,534,751 to Lenz et al.

Fairly sharp edges or corners are defined where the annular surface meets the upper and lower surfaces of the ring, although these corners are slightly rounded due to the process of manufacture or for safety reasons. The inventors of the present invention have discovered that these sharp edges define "delamination initiation corners" which throughout the course of heat cycling or temperature cycling creates a stress point in the deposited polymer or precursor film which facilitates interfacial crack propagation causing it to flake off the ring.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
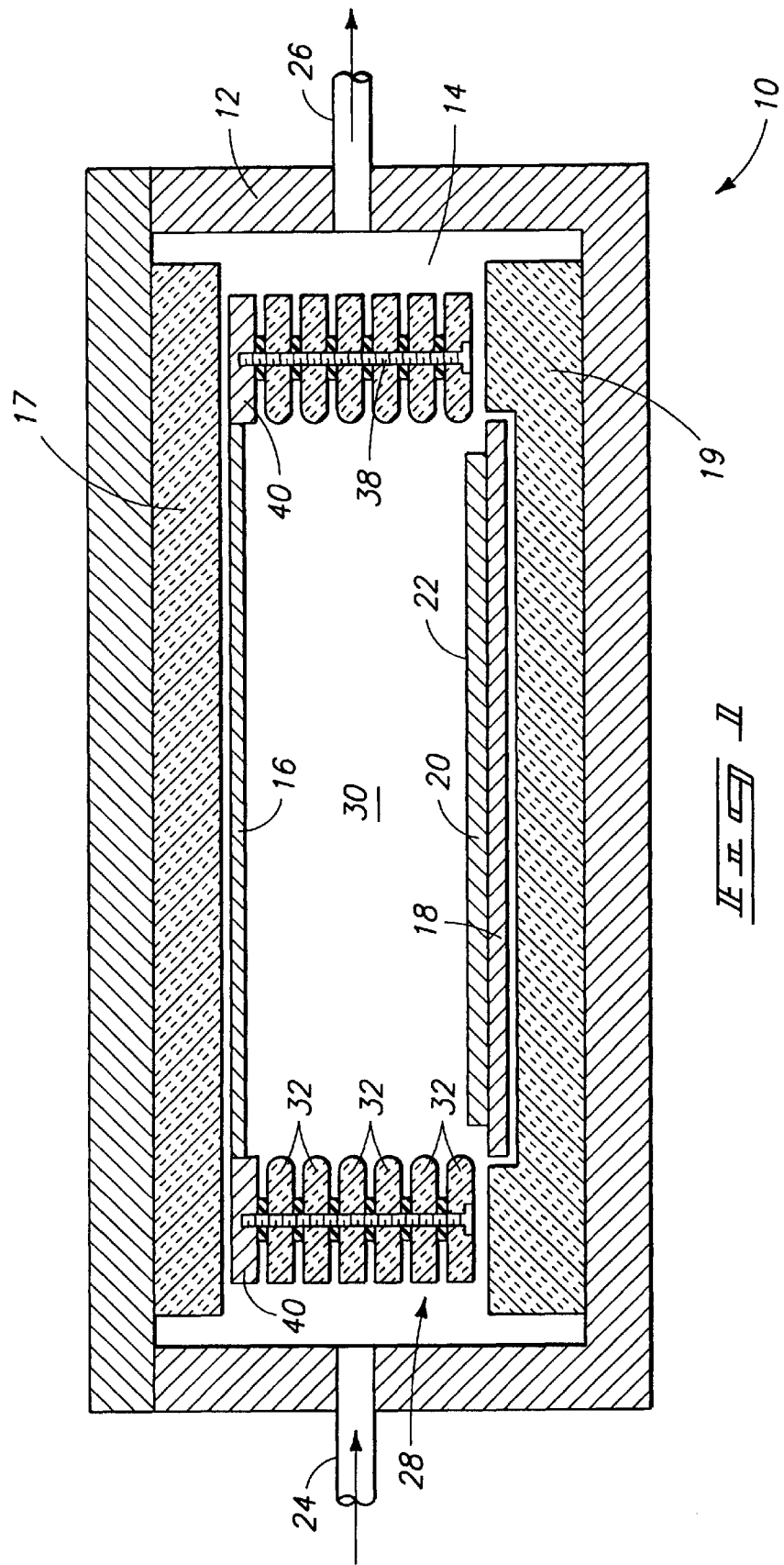
FIG. 1 is a front elevational view of a plasma reactor embodying the invention.

This disclosure of the invention is submitted in furtherance of the constitutional purposes of the U.S. Patent Laws "to promote the progress of science and useful arts" (Article 1, Section 8).

The invention provides a plasma reactor adapted to receive a semiconductor wafer, the plasma reactor comprising a reactor chamber; a support in the reactor chamber configured to receive a semiconductor wafer; and a plasma confinement ring above the support, the confinement ring including an upper surface, a lower surface, and an aperture extending between the first and second surfaces, the aperture defining an area in which plasma production is enhanced, the aperture being defined at least in part by a curved surface positioned between the first and second surfaces, the confinement ring being positioned with the aperture above the support.

In one aspect of the invention, a plasma confinement ring comprises a first generally planar surface; a second generally planar surface; and an aperture extending between the first and second surfaces, the aperture including an annular surface, and a curved surface extending between the annular surface and the first planar surface.

In another aspect of the invention, a plasma confinement ring comprises a first surface; a second surface; and an aperture extending between the first and second surfaces, the aperture having an axis and being defined by a surface extending between the first and second surfaces, the surface being convex towards the axis to limit stress riser points.

In another aspect of the invention, a quartz plasma confinement ring comprises a first generally planar surface; a second generally planar surface; an aperture extending between the first and second surfaces, the aperture being defined by an annular surface; and means for improving adhesion of fluorocarbon molecules to the annular surface.

In another aspect of the invention, a method of manufacturing a plasma reactor for processing a semiconductor wafer comprises providing a reactor chamber and an electrostatic chuck in the reactor chamber for supporting a semiconductor wafer; providing a plasma confinement ring having first and second opposite surfaces, an aperture extending between the first and second opposite surfaces, the aperture being defined by an annular surface; roughening the annular surface to increase the surface area; and positioning the ring in the chamber.

In another aspect of the invention, a method of manufacturing a plasma reactor for processing a semiconductor wafer comprises providing a reactor chamber and an electrostatic chuck in the reactor chamber for supporting a semiconductor wafer; providing a plasma confinement ring having first and second opposite surfaces, an aperture extending between the first and second opposite surfaces, the aperture being defined by an annular surface, an annular corner being defined at the intersection of the annular surface and the first surface; rounding the annular corner to provide a gradual transition from the annular surface to the first surface; and positioning the ring in the chamber.

In another aspect of the invention, a method of processing a semiconductor wafer comprises providing a plasma reactor having a reactor chamber, and having an electrostatic chuck in the reactor chamber; providing a plasma confinement ring having first and second opposite surfaces, an aperture extending between the first and second opposite surfaces, the aperture being defined by an annular surface; roughening at least portions of the annular surface; placing the ring in the chamber; and placing a semiconductor wafer on the electrostatic chuck after the cleaning.

In another aspect of the invention, a method of processing a semiconductor wafer comprises providing a plasma reactor having a reactor chamber, and having an electrostatic chuck in the reactor chamber; providing a plasma confinement ring having first and second opposite surfaces, an aperture extending between the first and second opposite surfaces, the aperture being defined by an annular surface; rounding the annular surface to provide a gradual transition from the annular surface to the first surface and from the annular surface to the second surface, and roughening at least portions of the annular surface; placing the ring in the chamber; cleaning the annular surface by introducing an oxidizing gas into the chamber and initiating formation of a plasma in the chamber; placing a semiconductor wafer on the electrostatic chuck; and etching the semiconductor wafer.

FIG. 1 shows a plasma reactor 10 embodying the invention. The plasma reactor 10 is used for plasma etching or other plasma aided processes such as chemical vapor deposition. The plasma reactor 10 includes a housing 12 defining a reactor chamber 14. The plasma reactor 10 further includes two spaced apart electrodes 16 and 18. In one embodiment, the electrodes 16 and 18 respectively include planar, parallel surfaces which are circular. In one embodiment, the circular surface of the electrode 16 has a diameter which is approximately equal to the diameter of the circular surface of the electrode 18. The electrode 18 defines a susceptor, electrostatic chuck, or other support for receiving a workpiece 20. In the illustrated embodiment, the workpiece 20 is a semiconductor wafer. The electrode 18 is sized to support semiconductor wafers that are typically six or eight inches in diameter. Thus, the electrode 18 typically has a diameter of between about 7 and 9 inches. The electrodes 16 and 18 are spaced apart by between about one inch and about one and three quarters inches. The reactor 10 further includes a dielectric layer 17 above the electrode 16, and a dielectric layer 19 under the electrode 18. The semiconductor wafers processed by the reactor 10 respectively have upper surfaces 22 including one or more layers in which vias or patterns are to be etched.

The reactor 10 includes an inlet 24 through which processes gasses are introduced into the chamber 14, and includes an outlet 26 through which spent gasses are exhausted from the chamber 14.

In operation, process gasses are introduced into the chamber 14, and a voltage including different frequency components is established between the two electrodes 16 and 18 to ionize process gasses in the chamber 14 to form a plasma. The plasma etches exposed surfaces of the semiconductor wafer 20.

Figure 2:
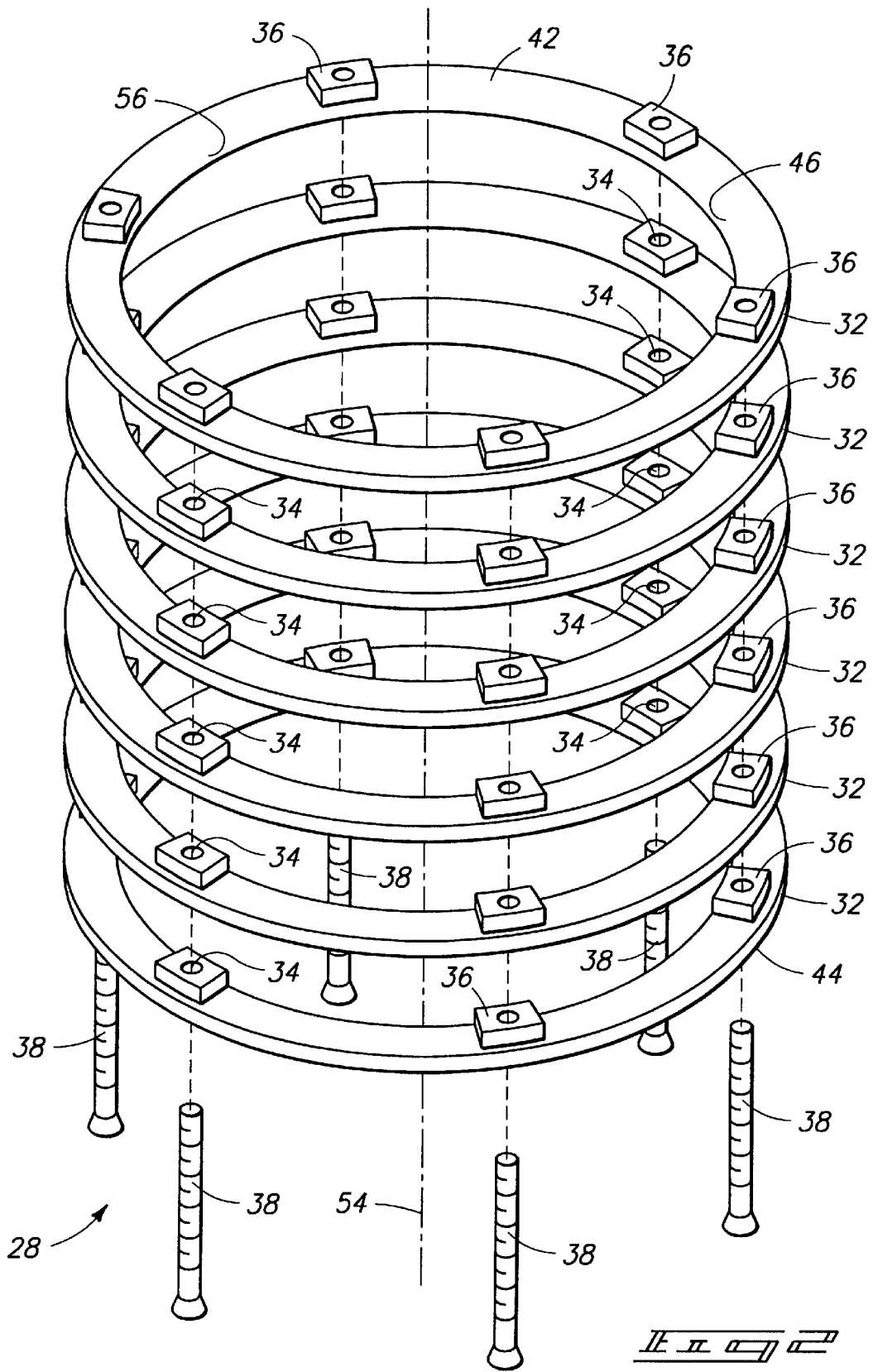
FIG. 2 is an exploded perspective view of a stack of plasma confinement rings included in the plasma reactor of FIG. 1.

The plasma reactor 10 includes a ring assembly 28 supported in the chamber 14 to confine plasma to an area 30 between the electrodes 16 and 18. The ring assembly 28 includes a plurality (e.g. two to six) of stacked plasma enhancement or plasma confinement rings 32. The respective rings 32 are formed of high quality fused silica or quartz, such as GE 224. The rings 32 respectively include radially spaced apart bolt holes 34 (FIG. 2) for assembly. In one embodiment, the ring assembly 28 further includes spacers 36 positioned axially between bolt holes 34 of adjacent rings, separating rings 32 in the stack from each other. The spacers 36 may be washers or raised portions of the rings 32. The spacers 36 may be formed of quartz. The ring assembly 28 further includes a plurality of teflon screws 38 threaded through the bolt holes 34 of the rings 32 and through the spacers 36 to define a rigid assembled structure. In the illustrated embodiment, the reactor 10 further 8 includes an annular upper plate 40 (FIG. 1) surrounding the electrode 16 and supported by the reactor housing 12 or the dielectric layer 17. The screws 38 are threaded into the plate 40 to support the rings 38 in the chamber.

Respective plasma confinement rings 38 include a first or upper surface 42, a second or lower surface 44, and an aperture 46 extending between the upper and lower surfaces 42 and 44. In the illustrated embodiment, the upper and lower surfaces 42 and 44 are planar and parallel to each other. The apertures 46 of the plasma confinement rings define the confinement area 30 in which plasma production is contained. The apertures 46 in the respective rings focus or centralize the plasma over the wafer 20.

The plasma reactor 10 is similar to the reactor described in U.S. Pat. No. 5,534,751 to Lenz et al., which is incorporated herein by reference, except that the plasma rings are modified as will now be described. In one embodiment, the plasma reactor 10 is a 4520 XL Advanced Diode Oxide Etcher sold by Lam Research Corporation.

In the course of the plasma etching, and particularly with fluorine gas chemistry (using a perfluorocarbon gas such as $CF_4$ or $C_4F_8$ or a hydrofluorocarbon such as $CHF_3$ or $C_2HF_5$) a polymer or polymer precursor forms and grows over the inner aperture 46 of the rings. The apertures 46 see much more of the plasma than the upper and lower surfaces 42 and 44. This is because plasma is inherently concentrated against the aperture to a greater degree than with respect to the upper and lower surfaces 42 and 44. This polymer/precursor continues to build until the point where it must be cleaned from the upper and lower surfaces 42 and 44. If it is not cleaned soon enough, it starts to flake-off and fall and deposit on the electrostatic chuck 18, thus inhibiting subsequent placement of wafers in a manner necessary to achieve electrostatic chucking. It may also fall onto a wafer 20 being processed, resulting in surface defects on the wafer 20. In both cases it becomes necessary to stop processing and to clear the chamber.

Although it is desirable to remove the build-up, in the preferred embodiment of the invention, adhesion of this material to the ring is enhanced. The inventors have determined that if adhesion is enhanced, cleaning intervals can be extended. Therefore, in the illustrated embodiment, the rings respectively include means for improving adhesion of fluorocarbon molecules and short-chain polymers to the annular surface.

Figure 3:
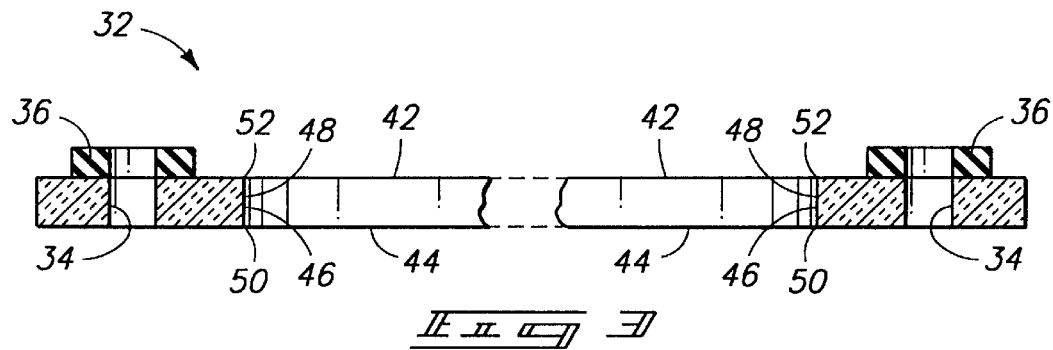
FIG. 3 is a sectional view of a prior art plasma confinement ring, taken along a diametrical sectional line.

One method of improving adhesion includes rounding the aperture 46 or beveling it, such that there is no sharp pointed corner as there is in the prior art plasma confinement rings. The aperture 46 is generally in the shape of an inner cylindrical surface prior to the rounding (FIG. 3). More particularly, prior to the rounding, the aperture 46 has an annular surface 48, an annular corner 50 defined at the intersection of the annular surface 48 and the lower surface 44, and an annular corner 52 defined at the intersection of the annular surface 48 and the upper surface 42. The term "corner," as used herein, is intended to encompass corners that are slightly rounded; e.g., corners that are slightly rounded for safety reasons; but where the annular surface 48 still includes a major portion normal to the upper and lower surfaces 42 and 44.

The corners 50 and 52 define delamination initiation corners which, throughout the course of heat cycling or temperature cycling, create stress points in the deposited film which facilitates flaking off of the deposited film from the ring 32. Accordingly, by removing the sharp corners 50 and 52, better tenacity of the undesired material will occur such that it stays longer on respective rings 32, thus extending the intervals between cleaning operations.

Thus, in the preferred embodiment, the apertures 46 of respective rings 28 are defined at least in part by a curved surface positioned between the upper and lower surfaces 42 and 44. The annular corner 50 is rounded to provide a gradual transition from the annular surface 48 to the lower surface 44. The annular corner 52 is also rounded to provide a gradual transition from the annular surface 48 to the upper surface 42. More particularly, an axis 54 (FIG. 2) is defined by the apertures 46 of the rings 32, and the apertures 46 of respective rings 32 include a surface 56 that is convex towards the axis 54. In the illustrated embodiment, the curved surface has a radius equal to half of the distance between the upper and lower surfaces 42 and 44 and extends from the upper surface 42 to the lower surface 44.

The corners 50 and 52 can be rounded in various ways. For example, the corners 50 and 52 can be rounded by etch pitting the annular surface. Alternatively, the corners 50 and 52 can be rounded by heating the corners 50 and 52 of the annular surface to the melting point of the quartz material and reflowing the corners 50 and 52.

Figure 4:
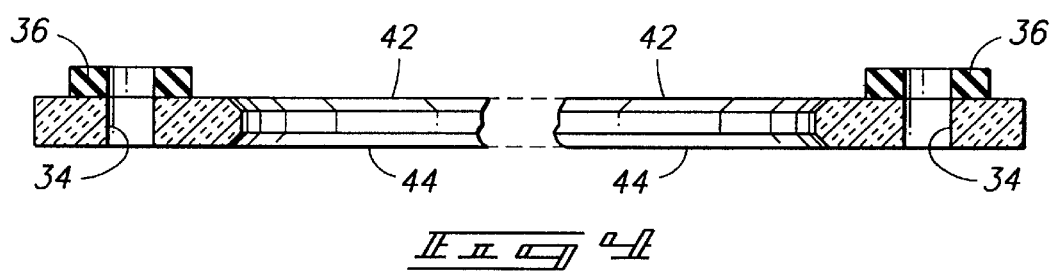
FIG. 4 is a sectional view of one of the plasma confinement rings of FIG. 2, taken along a diametrical section line 3—3, showing a central aperture after a first processing step in accordance with the invention.
Figure 5:
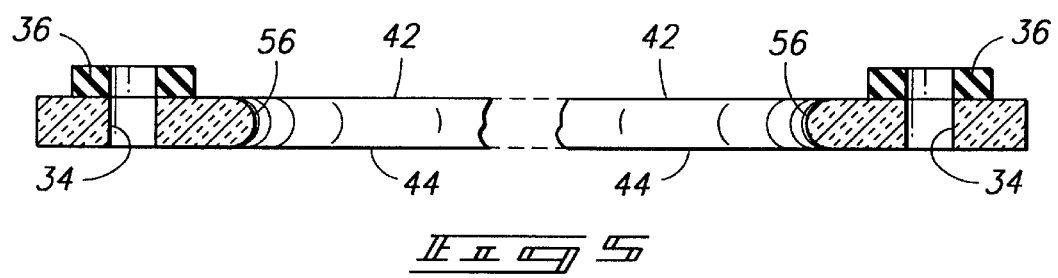
FIG. 5 is a sectional view of the plasma ring of FIG. 4 after a second processing step in accordance with the invention.
Figure 6:
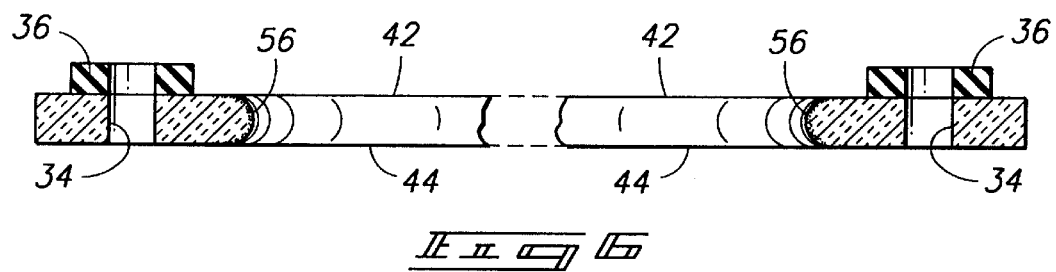
FIG. 6 is a sectional view of the plasma ring of FIG. 4 after a third processing step in accordance with the invention.

In one embodiment, the corners 50 and 52 are rounded by first employing a chamfer method machining process (FIG. 4) without heating, and then using a hand method (e.g., sanding) to complete the rounding (FIG. 5).

Before the curved surface is defined, respective rings have an inner diameter slightly greater than the diameter of the semiconductor wafer, an outer diameter of about 10.3 inches, and a thickness (between the upper and lower surfaces) of about 0.75 inches.

Another method of enhancing adhesion comprises increasing the available surface area by roughening or dimpling at least the annular surface 48 of the rings 30 to cause the material to adhere to the rings 30. The roughening can be performed instead of, or in addition to the rounding. Some methods of rounding will inherently also result in roughening. The primary surface of interest is the annular surface 48, but the upper and lower surfaces 42 and 44 are also roughened in one embodiment. In the illustrated embodiment, the curved surface 56 is roughened, as well as annular portions of the upper and lower surface 42 and 44 contiguous with the curved surface 56 and respectively extending radially outwardly from the curved surface 56 by a distance of at least 0.125 inches.

Example techniques for this roughening include beadblasting or mechanical machining, or an etch with a hydrofluoric acid. In one embodiment, the roughening is performed using 100–220 grit size in a bead blaster. While any bead blaster can be employed, in one embodiment, the bead blaster employed is a Guyson model F-2000.

With the combination of the rounding and the roughening, intervals between cleaning operations can be extended at least twice, maybe up to ten times, over what they are now. For example, chamber cleaning of conventional reactors typically takes place after 1000 wafers are processed. In accordance with the invention, it may be possible to process 2000 wafers before needing to perform a chamber clean.

In one embodiment of the invention, the reactor is initially subjected to an oxygen plasma clean subsequent to the wet clean and prior to etching. For example, for a 20 liter reactor, an oxygen-only (100% $O_2$) clean under vacuum with an $O_2$ flow rate of 70–200 sccm and 200 milliTorr pressure is performed with 200–800 Watts, 27 MHz provided to the top electrode and 100–1100 Watts, 2 MHz provided to the bottom electrode. $O_3$ or argon can be added in alternative embodiments. This initial cleaning has the effect of volatilizing residual solvents adsorbed on inner surfaces and creates a pristine surface for subsequent polymer adhesion.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of processing a semiconductor wafer comprising:

providing a plasma reactor having a reactor chamber, and having an electrostatic chuck in the reactor chamber;

providing a plasma confinement ring having first and second opposite surfaces, an aperture extending between the first and second opposite surfaces, the aperture being defined by an annular surface;

rounding the annular surface;

roughening at least portions of the annular surface after the rounding;

placing the ring in the chamber; and placing a semiconductor wafer on the electrostatic chuck.

2. A method of processing a semiconductor wafer in accordance with claim 1 wherein the roughening comprises bead blasting the annular surface.

3. A method of processing a semiconductor wafer in accordance with claim 1 and further comprising cleaning the annular surface after the roughening.

4. A method of processing a semiconductor wafer comprising:

providing a plasma reactor having a reactor chamber, and having an electrostatic chuck in the reactor chamber;

providing a plasma confinement ring having first and second opposite surfaces, and an aperture extending between the first and second opposite surfaces, the aperture being defined by an annular surface;

rounding the annular surface by etch pitting the annular surface;

roughening at least portions of the annular surface, after the rounding;

placing the ring in the chamber; and placing a semiconductor wafer on the electrostatic chuck.

5. A method of processing a semiconductor wafer in accordance with claim 1 and further comprising oxide etching the semiconductor wafer using between 0 and 100 percent hydrofluorocarbon gasses and between 0 and 100 percent perfluorocarbon gasses.

6. A method of processing a semiconductor wafer comprising:

providing a plasma reactor having a reactor chamber, and having an electrostatic chuck in the reactor chamber;

providing a plasma confinement ring having first and second opposite surfaces, an aperture extending between the first and second opposite surfaces, the aperture being defined by an annular surface;

rounding the annular surface by heating the annular surface;

roughening at least portions of the annular surface, after the rounding;

placing the ring in the chamber; and placing a semiconductor wafer on the electrostatic chuck.

7. A method of processing a semiconductor wafer comprising:

providing a plasma reactor having a reactor chamber, and having an electrostatic chuck in the reactor chamber;

providing a plasma confinement ring having first and second opposite surfaces, and an aperture extending between the first and second opposite surfaces, the aperture being defined by an annular surface;

rounding the annular surface by reflowing the annular surface;

roughening at least portions of the annular surface;

placing the ring in the chamber, and placing a semiconductor wafer on the electrostatic chuck.

8. A method of processing a semiconductor wafer comprising:

providing a plasma reactor having a reactor chamber, and having an electrostatic chuck in the reactor chamber;

providing a plasma confinement ring having first and second opposite surfaces, and an aperture extending between the first and second opposite surfaces, the aperture being defined by an annular surface;

rounding the annular surface to provide a gradual transition from the annular surface to the first surface and from the annular surface to the second surface, and roughening at least portions of the annular surface;

placing the ring in the chamber;

cleaning the annular surface by introducing an oxidizing gas into the chamber and initiating formation of a plasma in the chamber;

placing a semiconductor wafer on the electrostatic chuck; and etching the semiconductor wafer.

9. A method of processing a semiconductor wafer in accordance with claim 8 wherein the semiconductor wafer is placed on the electrostatic chuck prior to the cleaning.

10. A method of processing a semiconductor wafer in accordance with claim 8 wherein the semiconductor wafer is placed on the electrostatic check after the cleaning.

11. A method of processing a semiconductor wafer in accordance with claim 8 wherein the roughening comprises bead blasting.

12. A method of processing a semiconductor wafer in accordance with claim 8 wherein the roughening comprises etch pitting at least portions of the annular surface.

13. A method of processing a semiconductor wafer in accordance with claim 8 wherein the rounding comprises heating at least portions of the annular surface.

14. A method of processing a semiconductor wafer in accordance with claim 8 wherein the rounding comprises reflowing at least portions of the annular surface.

15. A method of processing a semiconductor wafer in accordance with claim 8 and further comprising oxide etching the semiconductor wafer using between 0 and 100 percent hydrofluorocarbon gasses and between 0 and 100 percent perfluorocarbon gasses.

16. A method of manufacturing a plasma reactor for processing a semiconductor wafer, the method comprising:

providing a reactor chamber and an electrostatic chuck in the reactor chamber for supporting a semiconductor wafer;

providing a plasma confinement ring having first and second opposite surfaces, an aperture extending between the first and second opposite surfaces, the aperture being defined by an annular surface, an annular corner being defined at the intersection of the annular surface and the first surface;

rounding the annular corner to provide a gradual transition from the annular surface to the first surface;

roughening the gradual transition; and positioning the ring in the chamber.

17. A method in accordance with claim 16 wherein the annular surface is in the shape of an inner cylindrical surface prior to the rounding.

18. A method in accordance with claim 16 wherein a second annular corner is defined at the intersection of the annular surface and the second surface, the method further comprising rounding the second annular corner to provide a gradual transition from the annular surface to the second surface.

19. A plasma reactor for processing a semiconductor wafer, the reactor comprising:

a reactor chamber, and an electrostatic chuck in the reactor chamber;

a plasma confinement ring having first and second opposite surfaces, and an aperture extending between the first and second opposite surfaces, the aperture being defined by an annular surface which is rounded from the first surface to the second opposite surface, and which is also roughened; and a support configured to support the plasma confinement ring in the chamber with the aperture of the plasma confinement ring adjacent the electrostatic chuck to define a plasma confinement area proximate the electrostatic chuck, wherein the the electrostatic chuck is configured to support a semiconductor wafer facing the plasma confinement area.

20. A plasma reactor in accordance with claim 19 wherein the roughened surface of the plasma confinement ring is defined by bead blasting.

21. A plasma reactor in accordance with claim 19 wherein the rounded surface of the plasma confinement ring is defined by etch pitting.

22. A plasma reactor in accordance with claim 19 wherein the rounded surface of the plasma confinement ring is defined by reflowing portions of the plasma confinement ring proximate the aperture.

23. A plasma reactor adapted to receive a semiconductor wafer, the plasma reactor comprising:

a reactor chamber;

a stack of quartz plasma enhancement rings respectively having first and second opposite planar surfaces and an aperture extending between the first and second opposite planar surfaces, the aperture having an axis and being defined by an annular surface which is rounded from both the first and second surfaces to define a contiguously curved shape that is generally convex towards the axis;

a support configured to support the stack of plasma confinement rings in the chamber with the respective apertures coaxially aligned to together define an undulating plasma enhancement area; and an electrostatic chuck in the reactor chamber and configured to support a semiconductor wafer proximate the plasma enhancement area.

24. A plasma reactor in accordance with claim 23 wherein the support and the electrostatic chuck are relatively positioned such that the plasma enhancement area is positioned, in operation, above the electrostatic chuck.

25. A plasma reactor in accordance with claim 23 wherein the rings respectively include radially spaced support apertures which are aligned when the enhancement area is defined, wherein the support comprises radially spaced apart rods configured to respectfully extend through the aligned support apertures.

26. A plasma reactor in accordance with claim 23 wherein the rounded surface of the respective rings is roughened.

27. A plasma reactor in accordance with claim 23 wherein the first planar surface is parallel to the second planar surface for the respective rings.

28. A plasma enhancement ring for use in a reactor for processing a semiconductor wafer, the reactor including a reactor chamber, and an electrostatic chuck in the reactor chamber, the plasma enhancement ring comprising:

quartz material having first and second opposite planar surfaces, and an aperture extending between the first and second opposite surfaces, the aperture being defined by an annular surface which is rounded from the first surface to the second opposite surface, and which is also roughened, wherein the ring is configured to be supported in the chamber with the aperture of the plasma enhancement ring adjacent the electrostatic chuck such that the aperture defines a plasma enhancement area proximate the electrostatic chuck.

* * * * *

UNITED STATES PATENT AND TRADEMARK OFFICE
CERTIFICATE OF CORRECTION

PATENT NO. : 6,008,130
DATED : December 28, 1999
INVENTOR(S) : David E. Henderson, Ian Harvey It is certified that error appears in the above-identified patent and that said Letters Patent is hereby corrected as shown below:

Column 7,
Line 64, replace "check" with -- chuck --.

Column 8,
Line 53, delete the second instance of "the".

Signed and Sealed this

Fourteenth Day of August, 2001

Attest:

NICHOLAS P. GODICI
*Attesting Officer*     *Acting Director of the United States Patent and Trademark Office*